United States Patent
Wu

(10) Patent No.: US 10,340,475 B2
(45) Date of Patent: Jul. 2, 2019

(54) OLED PANEL FABRICATION METHOD AND OLED PANEL

(71) Applicant: Wuhan China Star Optoelectronics Semiconductor Display Technology Co., Ltd., Wuhan (CN)

(72) Inventor: Chienlin Wu, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/571,035

(22) PCT Filed: Sep. 15, 2017

(86) PCT No.: PCT/CN2017/101972
§ 371 (c)(1),
(2) Date: Oct. 31, 2017

(87) PCT Pub. No.: WO2019/041386
PCT Pub. Date: Mar. 7, 2019

(65) Prior Publication Data
US 2019/0067629 A1 Feb. 28, 2019

(30) Foreign Application Priority Data
Aug. 28, 2017 (CN) ............ 2017 1 0751619

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3244* (2013.01); *H01L 51/0097* (2013.01);
(Continued)

(58) Field of Classification Search
None
See application file for complete search history.

(56) References Cited

U.S. PATENT DOCUMENTS

| 7,948,176 B2 | 5/2011 | Oh et al. |
| 2011/0133213 A1* | 6/2011 | Lee ............... H01J 7/183 |
| | | 257/79 |

(Continued)

FOREIGN PATENT DOCUMENTS

| CN | 105304676 A | 2/2016 |
| CN | 106816456 A | 6/2017 |

(Continued)

*Primary Examiner* — Dung A. Le
(74) *Attorney, Agent, or Firm* — Leong C. Lei

(57) ABSTRACT

The present invention provides an OLED panel fabrication method and an OLED panel. The OLED panel fabrication method of the present invention is such that at least two loops of spaced barrier walls are provided on an outer circumference of the OLED device and inkjet printing is applied to form, in sequence, an organic buffer layer between a first inorganic blocking layer and a second inorganic blocking layer at a location above a light emission area defined and delimited by the barrier walls and a loop of densification layer between the first inorganic blocking layer and the second inorganic blocking layer at a location above an area between two adjacent ones of the barrier walls so as to form a complicated path that retards invasion of water vapor and oxygen in a lateral side encapsulation structure to improve a lateral side film encapsulation effect thereby providing a film encapsulation structure having an increased gas blocking capability to effectively protect the OLED device, increase the life span of the OLED device, and suit the need of encapsulation of a flexible OLED panel. In addition, the fabrication method is easy to carry out.

15 Claims, 6 Drawing Sheets

(51) Int. Cl.
*H01L 51/56* (2006.01)
*H01L 51/00* (2006.01)

(52) U.S. Cl.
CPC .......... *H01L 51/5259* (2013.01); *H01L 51/56* (2013.01); *H01L 2251/5338* (2013.01)

(56) References Cited

U.S. PATENT DOCUMENTS

| | | | |
|---|---|---|---|
| 2012/0112212 A1* | 5/2012 | Kim | H01L 51/5246 257/88 |
| 2013/0240848 A1* | 9/2013 | Lin | H01L 51/52 257/40 |
| 2015/0228928 A1 | 8/2015 | Kim et al. | |
| 2016/0365395 A1* | 12/2016 | Xu | H01L 51/5246 |
| 2017/0331072 A1* | 11/2017 | Jo | H01L 51/56 |
| 2018/0138450 A1* | 5/2018 | Park | H01L 27/3211 |

FOREIGN PATENT DOCUMENTS

| | | |
|---|---|---|
| CN | 106953029 A | 7/2017 |
| CN | 106981584 A | 7/2017 |

\* cited by examiner

OLED PANEL FABRICATION METHOD AND OLED PANEL

BACKGROUND OF THE INVENTION

1. Field of the Invention

The present invention relates to the field of flat panel display technology, and more particular to an organic light emitting display (OLED) panel fabrication method and an OLED panel.

2. The Related Arts

Organic light-emitting display (OLED) possesses various advantages, such as being self-luminous, low drive voltage, high luminous efficiency, short response time, high clarity and contrast, nearly 180° view angle, wide range of operation temperature, and easy realization of flexible displaying and large-area full-color displaying, and is considered the most promising display device in the industry.

The OLED display technology is different from the traditional liquid crystal display technology in that no backlighting is necessary and a very thin layer of an organic material coating and a glass substrate are used instead, wherein when an electrical current flows through the organic materials, light emits therefrom. However, the organic material is susceptible to reaction with moisture and oxygen, as a display component based on organic materials, an OLED display screen requires a severe level of encapsulation. Encapsulating the OLED display device helps improve sealing of the interior thereof for isolation as much as possible from the outside. This is vital to stable light emission of the OLED device.

Heretofore, encapsulation of an OLED device is carried out by applying encapsulation gel on a rigid encapsulation substrate (made of glass or metal). Such a solution is not fit to flexible devices. Thus, techniques are available for encapsulation of an OLED device with stacked films. Such film-based encapsulation generally involves two layers of inorganic materials formed above an OLED device arranged on a substrate to form barrier layers having excellent property of resisting moisture and gas and a buffer layer made of an organic material that is flexible is arranged between the two barrier layers. Specifically, as shown in FIG. 1, a known film-encapsulated OLED device is provided, including a substrate 100, an OLED device 200 arranged on the substrate 100, and a film encapsulation layer 300 formed on the OLED device 200, wherein the film encapsulation layer 300 comprises a first inorganic barrier layer 310, an organic buffer layer 320 formed on the first inorganic barrier layer 310, and a second inorganic barrier layer 330 formed on the organic buffer layer 320.

The above film-based encapsulation is commonly used in encapsulating flexible OLED display screens. However, the encapsulation capability is generally difficult to achieve a level of which water vapor transmission rate (WVTR) is less than $10^{-6}$ g/m²/day and this often results in an issue of shortened life span of the flexible display screens.

In jet printing (IJP) technology has been recently used in encapsulation operations. An inkjet printer is a device that allows for localized coating to suit the design requirements and possesses the features of direct formation and reducing the need for metal masks and a vacuum environment, and an inkjet head of the printer generally include nozzles that have a diameter less than 100 μm, allowing for small and dense arrangements, and providing excellent capability of fine coating operations.

SUMMARY OF THE INVENTION

An objective of the present invention is to provide an organic light emitting display (OLED) panel fabrication method, which forms a complicated path in a sideway encapsulation structure to retard invasion of water vapor and oxygen so as to enhance lateral side encapsulation effect to thereby provide a film encapsulation structure having increased gas blocking capability.

Another objective of the present invention is to provide an OLED panel, which comprises a complicated path in a sideway encapsulation structure to retard invasion of water vapor and oxygen so as to enhance lateral side encapsulation effect to thereby provide a film encapsulation structure having increased gas blocking capability.

To achieve the above objectives, the present invention provides an OLED panel fabrication method, which comprises the following steps:

Step S1: providing a substrate, forming an OLED device on the substrate; and arranging at least two circumferential loops of barrier walls, which are spaced from each other, on the substrate along an outer circumference of the OLED device, wherein an innermost loop of the barrier walls defines and delimits a light emission area on the substrate;

Step S2: depositing a first inorganic blocking layer of an entire surface to completely cover the OLED device and entirety of the barrier walls;

Step S3: coating and forming an organic buffer layer on a portion of the first inorganic blocking layer that corresponds to the light emission area and coating and forming a densification layer on a portion of the first inorganic blocking layer that corresponds to an area between every two adjacent ones of the barrier walls; and Step S4: depositing a second inorganic blocking layer of an entire surface to completely cover the organic buffer layer, entirety of the densification layer, and the entirety of the barrier walls.

Step S3 adopts an inkjet printing operation to form the densification layer and the organic buffer layer, wherein the densification layer has a height equal to or less than a height of the barrier walls; and the height of the densification layer is equal to or greater than a height of the organic buffer layer.

The densification layer is formed of a material that comprises one or multiple ones of acrylate, epoxy, siloxane, silicon nitride, silicon dioxide, silicon oxynitride, aluminum oxide, and titanium oxide.

The densification layer comprises a moisture absorbent to provide a function of moisture absorption.

Step S2 adopts plasma enhanced chemical vapor deposition to deposit and form the first inorganic blocking layer;

Step S4 adopts plasma enhanced chemical vapor deposition to deposit and form the second inorganic blocking layer;

The barrier walls formed in Step S1 are formed of a material that comprises an organic photoresist material;

the organic buffer layer is formed of a material that comprises one or multiple ones of acrylate, epoxy, and siloxane; and the first inorganic blocking layer and the second inorganic blocking layer are each formed of a material that comprises one or multiple ones of silicon nitride, silicon dioxide, silicon oxynitride, aluminum oxide, and titanium oxide.

The present invention also provides an OLED panel, which comprises:

a substrate;

an OLED device arranged on the substrate;

at least two loops of barrier walls that are arranged on the substrate to be spaced from each other and located along an outer circumference of the OLED device, wherein an innermost one of the barrier walls defines and delimits a light emission area on the substrate;

a first inorganic blocking layer of an entire surface to completely cover the OLED device and entirety of the barrier walls;

an organic buffer layer arranged on a portion of the first inorganic blocking layer that corresponds to the light emission area;

a densification layer arranged between every two adjacent ones of the barrier walls; and a second inorganic blocking layer of an entire surface to completely cover the organic buffer layer, entirety of the densification layer, and the entirety of the barrier walls.

The densification layer has a height equal to or less than a height of the barrier walls; and the height of the densification layer is equal to or greater than a height of the organic buffer layer.

The densification layer is formed of a material that comprises one or multiple ones of acrylate, epoxy, siloxane, silicon nitride, silicon dioxide, silicon oxynitride, aluminum oxide, and titanium oxide.

The densification layer comprises a moisture absorbent to provide a function of moisture absorption.

The organic buffer layer is formed of a material that comprises one or multiple ones of acrylate, epoxy, and siloxane; and the first inorganic blocking layer and the second inorganic blocking layer are each formed of a material that comprises one or multiple ones of silicon nitride, silicon dioxide, silicon oxynitride, aluminum oxide, and titanium oxide.

The present invention further provides an OLED panel fabrication method, which comprises the following steps:

Step S1: providing a substrate, forming an OLED device on the substrate; and arranging at least two circumferential loops of barrier walls, which are spaced from each other, on the substrate along an outer circumference of the OLED device, wherein an innermost loop of the barrier walls defines and delimits a light emission area on the substrate;

Step S2: depositing a first inorganic blocking layer of an entire surface to completely cover the OLED device and entirety of the barrier walls;

Step S3: coating and forming an organic buffer layer on a portion of the first inorganic blocking layer that corresponds to the light emission area and coating and forming a densification layer on a portion of the first inorganic blocking layer that corresponds to an area between every two adjacent ones of the barrier walls; and Step S4: depositing a second inorganic blocking layer of an entire surface to completely cover the organic buffer layer, entirety of the densification layer, and the entirety of the barrier walls;

wherein the densification layer has a height equal to or less than a height of the barrier walls.

The efficacy of the present invention is that the present invention provides an OLED panel fabrication method, in which at least two loops of spaced barrier walls are provided on an outer circumference of the OLED device and inkjet printing is applied to form, in sequence, an organic buffer layer between a first inorganic blocking layer and a second inorganic blocking layer at a location above a light emission area defined and delimited by the barrier walls and a loop of densification layer between the first inorganic blocking layer and the second inorganic blocking layer at a location above an area between two adjacent ones of the barrier walls so as to form a complicated path that retards invasion of water vapor and oxygen in a lateral side encapsulation structure to improve a lateral side film encapsulation effect thereby providing a film encapsulation structure having an increased gas blocking capability to effectively protect the OLED device, increase the life span of the OLED device, and suit the need of encapsulation of a flexible OLED panel. In addition, the fabrication method is easy to carry out. The present invention provide an OLED panel, in which at least two loops of spaced barrier walls are provided on an outer circumference of the OLED device, wherein an organic buffer layer is arranged between a first inorganic blocking layer and a second inorganic blocking layer at a location above a light emission area defined and delimited by the barrier walls and a loop of densification layer is arranged between the first inorganic blocking layer and the second inorganic blocking layer at a location above an area between two adjacent ones of the barrier walls so as to form a complicated path that retards invasion of water vapor and oxygen in a lateral side encapsulation structure to improve a lateral side film encapsulation effect thereby providing a film encapsulation structure having an increased gas blocking capability to effectively protect the OLED device, increase the life span of the OLED device, and suit the need of encapsulation of a flexible OLED panel.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
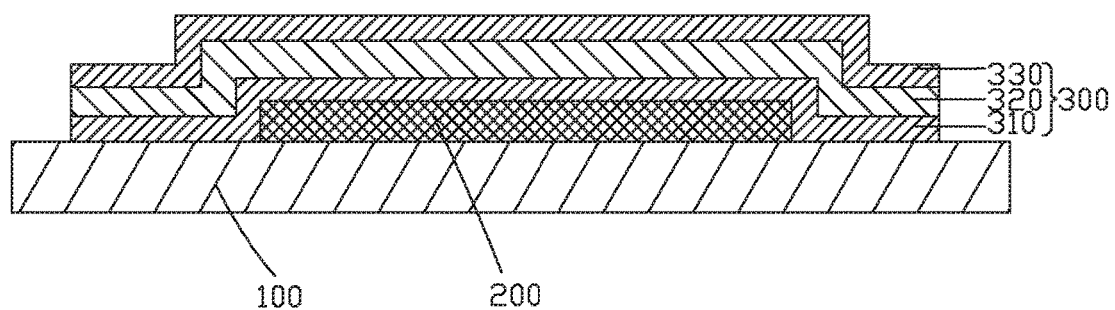
FIG. 1 is a schematic view illustrating a structure of a conventional film encapsulated organic light emitting display (OLED)
Figure 2:
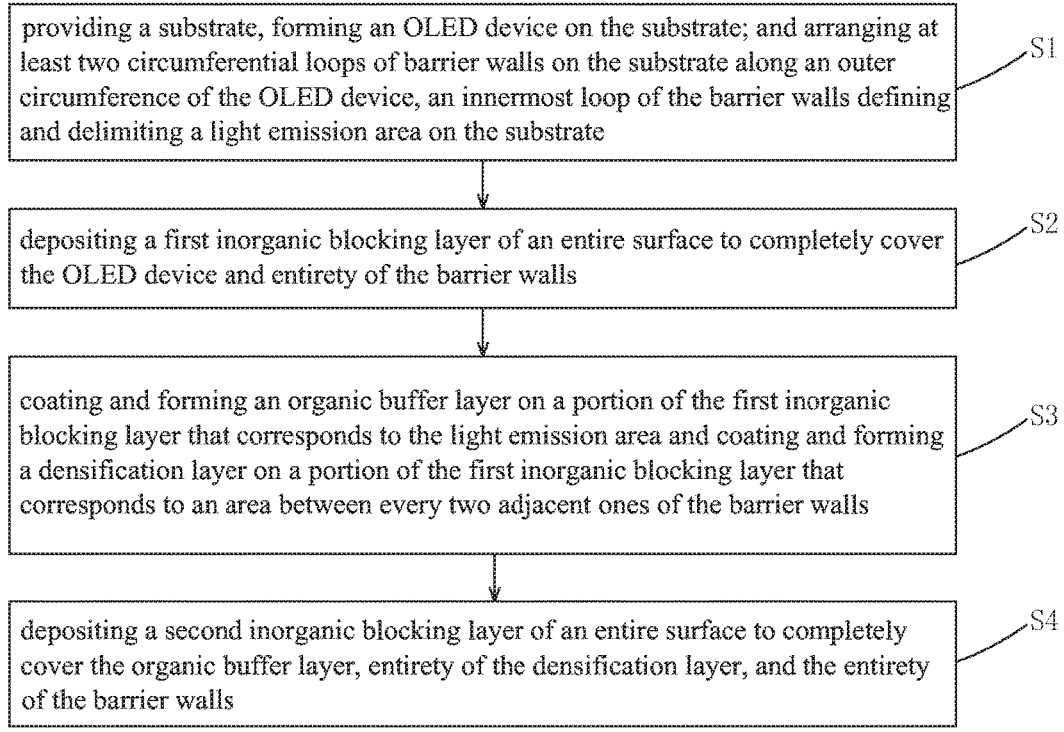
FIG. 2 is a flow chart illustrating an OLED panel fabrication method according to the present invention.
Figure 3:
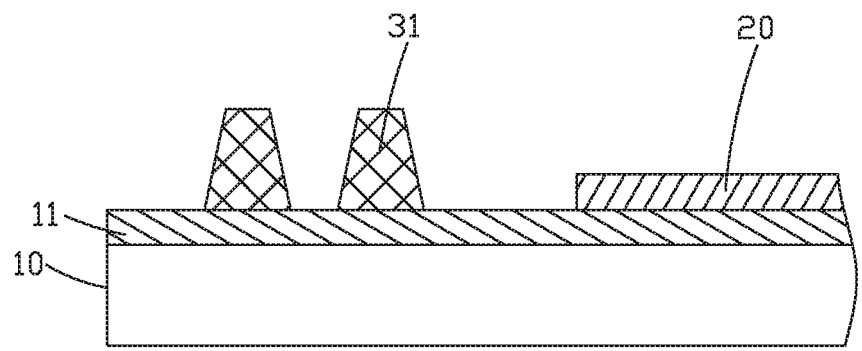
FIG. 3 is a schematic view illustrating Step S1 of a first example of the OLED panel fabrication method according to the present invention.

Referring to FIG. 2, firstly, the present invention provides an organic light emitting display (OLED) panel fabrication method. A first example of the OLED panel fabrication method according to the present invention specifically comprises the following steps:

Step S1: as shown in FIG. 3, providing a substrate 10, forming an OLED device 20 on the substrate 10; and arranging at least two circumferential loops of barrier walls 31, which are spaced from each other, on the substrate 10 along an outer circumference of the OLED device 20, wherein an innermost loop of the barrier walls 31 defines and delimits a light emission area on the substrate 10.

Specifically, the substrate 10 is a thin-film transistor (TFT) array substrate, which comprises a TFT layer 11 arranged thereon. The substrate 10 has a backing plate that can be a rigid board or a flexible board, such as a flexible polyimide (PI) board.

Specifically, the barrier walls 31 formed in Step S1 is formed of a material comprising an organic photoresist material, and a specific process of arranging the at least two circumferential loops of barrier walls 31, which are spaced from each other, on the substrate 10 along the outer circumference of the OLED device 20 comprises: depositing a layer of an organic photoresist material on the substrate 10 and subjecting the organic photoresist material to patterning with one mask so as to form the at least two spaced loops of barrier walls 31 along the outer circumference of the OLED device 20.

Preferably, in Step S1, two barrier walls 31 in the form of two circumferential loops, which are spaced from each other, are provided on the outer circumference of the OLED device 20.

Specifically, the OLED device 20 comprises a cathode, an electron injection layer, an electron transportation layer, an emissive layer, a hole transportation layer, a hole injection layer, and an anode that are stacked in sequence on the substrate 10.

Figure 4:
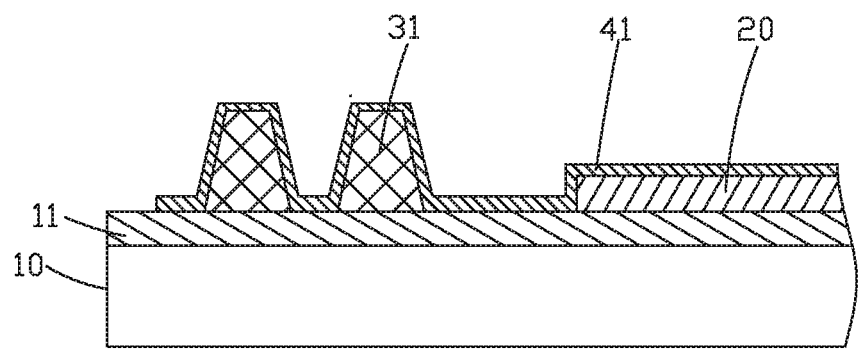
FIG. 4 is a schematic view illustrating Step S2 of the first example of the OLED panel fabrication method according to the present invention.

Step S2: as shown in FIG. 4, plasma enhanced chemical vapor deposition (PECVD) is applied to deposit a first inorganic blocking layer 41 of an entire surface on the substrate 10 to completely cover the OLED device 20 and entirety of the barrier walls 31.

Specifically, the first inorganic blocking layer 41 is formed of a material that is an inorganic material, such as silicon nitride (SiNx), silicon dioxide ($SiO_2$), silicon oxynitride (SiON), aluminum oxide ($Al_2O_3$), and titanium oxide ($TiO_2$).

Specifically, the first inorganic blocking layer 41 has a thickness less than or equal to 1 μm.

Preferably, the first inorganic blocking layer 41 is arranged to cover all the barrier walls 31, so as to form a coverage area on the substrate 10 to extend to an outer edge of an outermost loop of the barrier walls 31.

Figure 5:
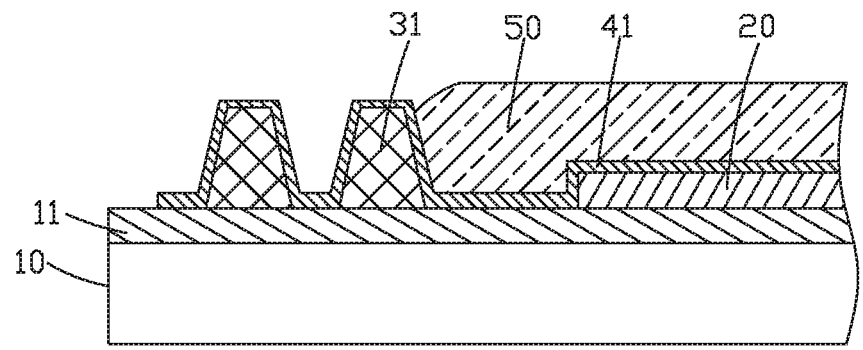
FIGS. 5-6 are schematic views illustrating Step S3 of the first example of the OLED panel fabrication method according to the present invention.
Figure 6:
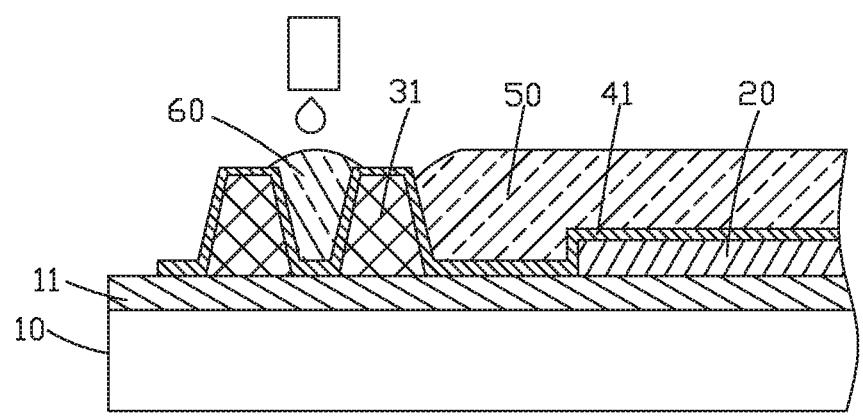

Step S3: as shown in FIGS. 5 and 6, applying an inkjet printing operation by using an inkjet printing device to coat and form an organic buffer layer 50 on a portion of the first inorganic blocking layer 41 that corresponds to the light emission area and coating and forming a loop of densification layer 60 on a portion of first inorganic blocking layer 41 that corresponds to an area between every two adjacent ones of the barrier walls 31.

Specifically, the densification layer 60 formed in Step S3 has a height equal to or less than a height of the barrier walls 31 and the height of the densification layer 60 is equal to or greater than a height of the organic buffer layer 50. This helps limit and reduce the thickness of the organic buffer layer 50 so as to provide an effect of making light and thin encapsulation and also helps prevent water vapor and oxygen from fast invading into the OLED device 20 by way of the organic buffer layer 50.

Specifically, Step S3 preferably uses an inkjet printing operation to form the organic buffer layer 50 and the densification layer 60, and alternatively, this step may involve other processes to form the organic buffer layer 50 and the densification layer 60, such as fabrication by means of a dispenser, a spraying machine, and a coating machine, or fabrication done with operations of screen printing, laser induced thermal image (LITI), and laser induced pattern wise sublimation (LIPS).

Specifically, a specific process of the inkjet printing operation adopted in Step S3 to form the organic buffer layer 50 and the densification layer 60 comprises: using the inkjet printing device to print a layer of the organic material on the portion of the first inorganic blocking layer 41 that corresponds to the light emission area and after a predetermined time period of being kept still, subjecting the organic material to curing so as to form the organic buffer layer 50, and then, printing an organic material or an inorganic material on the portion of the first inorganic blocking layer 41 that corresponds to the area between two adjacent ones of the barrier walls 31 and after a predetermined time period of being kept still, subjecting the organic material or the inorganic material to curing to form the densification layer 60, wherein an operation that carries out the curing is selected as thermal curing or ultraviolet (UV) curing according to a property of the printed material.

Specifically, the organic buffer layer 50 is formed of a material that is an organic material, such as acrylate, epoxy, and siloxane.

Specifically, the densification layer 60 is formed by coating an organic material through inkjet printing and further, the organic material can be acrylate, epoxy, or siloxane; or alternatively, the densification layer 60 is formed by coating, through inkjet printing, an ink material formulated with an inorganic material and further, the inorganic material can be silicon nitride, silicon dioxide, silicon oxynitride, aluminum oxide, or titanium oxide. It is certain that in addition to the above, the densification layer 60 can be simply formed of an inorganic material by means of other known processes to provide an effect of isolation of water vapor.

Preferably, the densification layer 60 provides a function of water absorption by including a moisture absorbent, such as calcium chloride ($CaCl_2$), cobalt chloride ($CoCl_2$), calcium sulfate ($CaSO_4$), silica gel, active aluminum oxide ($Al_2O_3$), calcium hydride ($CaH_2$), magnesium sulfate ($MgSO_4$), and aluminosilicates. When external water vapor transmits through the barrier walls 31 and enters the densification layer 60, the moisture absorbent of the densification layer 60 absorbs and holds the moisture to prevent the moisture from entering the OLED device 20.

Figure 7:
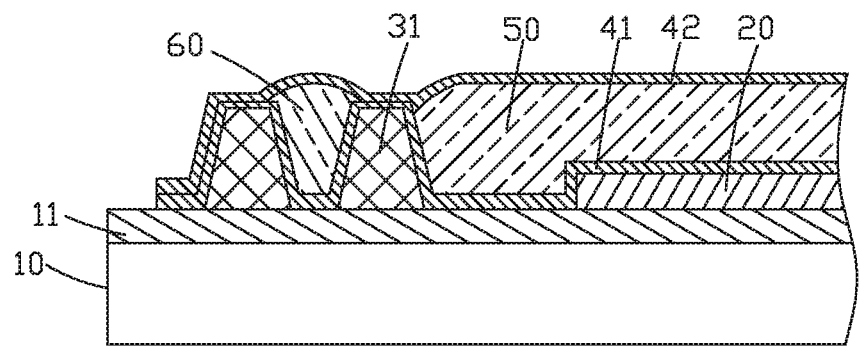
FIG. 7 is a schematic view illustrating Step D4 of the first example of the OLED panel fabrication method according to the present invention and is also a schematic view illustrating a structure of the OLED panel of the first example of the present invention.

Step S4: as shown in FIG. 7, depositing a second inorganic blocking layer 42 of an entire surface to completely cover the organic buffer layer 50, the entirety of the densification layer 60, and the entirety of the barrier walls 31.

Specifically, in Step S4, plasma enhanced chemical vapor deposition is adopted to deposit and form the second inorganic blocking layer 42.

Specifically, the second inorganic blocking layer 42 is formed of a material that is an inorganic material, such as silicon nitride, silicon dioxide, silicon oxynitride, aluminum oxide, and titanium oxide.

Specifically, the second inorganic blocking layer 42 and the first inorganic blocking layer 41 are both of a thickness that is 1 less than or equal to 1 µm in order to limit and reduce the thicknesses of the first inorganic blocking layer 41 and the second inorganic blocking layer 42 so as to provide an effect of making light and thin encapsulation and also to help prevent film breaking due to bending of a flexible product. The second inorganic blocking layer 42 is arranged to form a coverage area on the substrate 10 to extend to an edge of the substrate 10 to thereby enhance a lateral side film encapsulation effect.

With the OLED panel fabrication method described above, at least two loops of barrier walls 31 that are spaced from each other are arranged along an outer circumference of the OLED device 20 and a loop of densification layer 60 is formed between every two adjacent ones of the barrier walls 31 and sandwiched between the first inorganic blocking layer 41 and the second inorganic blocking layer 42 so as to provide a complicated path that retards invasion of water vapor and oxygen in the lateral side encapsulation structure and thus enhance lateral side film encapsulation effect to provide a film encapsulation structure having increased gas blocking capability, which may effectively protect the OLED device 20 to thereby extend the life span of the OLED device 20, suit the need of encapsulation of a flexible OLED panel, and achieve a process that is simple and easy to carry out.

Figure 8:
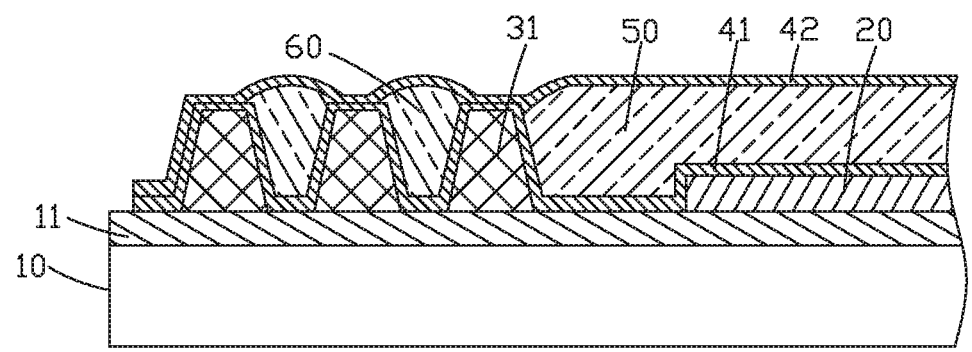
FIG. 8 is a schematic view illustrating Step D4 of a second example of the OLED panel fabrication method according to the present invention and is also a schematic view illustrating a structure of the OLED panel of the second example of the present invention.

Referring to FIG. 8, a second example of the OLED panel fabrication method according to the present invention is provided, which is different from the first example described above in that in Step S1, three loops of barrier walls 31 that are spaced from one another are formed along an outer circumference of the OLED device 20 and corresponding thereto, in Step S3, two loops of densification layer 60 are coated and formed and in Step S4, the second inorganic blocking layer 42 is arranged to cover both loops of the densification layer 60, so that an encapsulation structure obtained in Step S4 is that illustrated in FIG. 8. The remaining features are similar to those of the first example and repeated description will be omitted herein. It is certainly possible to provide more than three loops of barrier walls 31 according to the needs of different products in order to further enhance lateral side film encapsulation effect.

Based on the OLED panel fabrication method described above, the present invention also provides an OLED panel. Referring to FIG. 7, a first example of the OLED panel according to the present invention specifically comprises:

a substrate 10;

an OLED device 20 arranged on the substrate 10;

two loops of barrier walls 31 that are arranged on the substrate 10 to be spaced from each other and located along an outer circumference of the OLED device 20, wherein an innermost one of the barrier walls 31 defines and delimits a light emission area on the substrate 10;

a first inorganic blocking layer 41 of an entire surface to completely cover the OLED device 20 and entirety of the barrier walls 31;

an organic buffer layer 50 arranged on a portion of the first inorganic blocking layer 41 that corresponds to the light emission area;

a densification layer 60 arranged between the two barrier walls 31; and a second inorganic blocking layer 42 of an entire surface to completely cover the organic buffer layer 50, the entirety of the densification layer 60, and the entirety of the barrier walls 31.

Specifically, the densification layer 60 has a height equal to or less than a height of the barrier walls 31 and the height of the densification layer 60 is equal to or greater than a height of the organic buffer layer 50.

Specifically, the densification layer 60 is formed by means of inkjet printing and optionally, the densification layer 60 is formed by coating an organic material through inkjet printing, and further, the organic material can be acrylate, epoxy, or siloxane; or alternatively, the densification layer 60 is formed by coating, through inkjet printing, an ink material formulated with an inorganic material and further, the inorganic material can be silicon nitride, silicon dioxide, silicon oxynitride, aluminum oxide, or titanium oxide. It is certain that in addition to the above, the densification layer 60 can be simply formed of an inorganic material by means of other known processes to provide an effect of isolation of water vapor.

Preferably, the densification layer 60 provides a function of water absorption by including a moisture absorbent.

Specifically, the first inorganic blocking layer 41 has a thickness less than or equal to 1 µm.

Preferably, the first inorganic blocking layer 41 is sized to exactly cover all the barrier walls 31, such that a coverage area thereof on the substrate 10 extends to just reach an outer edge of an outermost loop of the barrier walls 31.

Specifically, the second inorganic blocking layer 42 has a thickness less than or equal to 1 µm and has a coverage area on the substrate 10 that extends to an edge of the substrate 10.

Specifically, the barrier walls 31 are formed of a material that comprises an organic photoresist material.

Specifically, the organic buffer layer 50 is formed by means of inkjet printing and the organic buffer layer 50 is formed of a material that is an organic material, such as acrylate, epoxy, and siloxane.

Specifically, the first inorganic blocking layer 41 and the second inorganic blocking layer 42 are both formed through deposition with plasma enhanced chemical vapor deposition.

Specifically, the first inorganic blocking layer 41 and the second inorganic blocking layer 42 are each formed of a material that is an inorganic material, such as silicon nitride, silicon dioxide, silicon oxynitride, aluminum oxide, and titanium oxide.

In the OLED panel described above, a loop of densification layer 60 is arranged in an area above two adjacent ones of the barrier walls 31 and located between the first inorganic blocking layer 41 and the second inorganic blocking layer 42 so as to provide a complicated path that retards invasion of water vapor and oxygen in the lateral side encapsulation structure and thus enhance lateral side film encapsulation effect to provide a film encapsulation structure having increased gas blocking capability, which may effectively protect the OLED device 20 to thereby extend the life span of the OLED device 20 and suit the need of encapsulation of a flexible OLED panel.

Referring to FIG. 8, a second example of the OLED panel according to the present invention is shown, which is different from the first example described above in that three loops of barrier walls 31 that are spaced from each other are formed on the substrate 10 and along an outer circumference of the OLED device 20 and corresponding thereto, two loops of densification layer 60 are provided on the outer circumference of the OLED device 20 and the second inorganic blocking layer is arranged to cover both loops of the densification layer 60. The remaining features are similar to those of the first example and repeated description will be omitted herein. It is certainly possible to provide more than three loops of barrier walls 31 according to the needs of different products in order to further enhance lateral side film encapsulation effect.

In summary, the present invention provides an OLED panel fabrication method, in which at least two loops of spaced barrier walls are provided on an outer circumference of the OLED device and inkjet printing is applied to form, in sequence, an organic buffer layer between a first inorganic blocking layer and a second inorganic blocking layer at a location above a light emission area defined and delimited by the barrier walls and a loop of densification layer between the first inorganic blocking layer and the second inorganic blocking layer at a location above an area between two adjacent ones of the barrier walls so as to form a complicated path that retards invasion of water vapor and oxygen in a lateral side encapsulation structure to improve a lateral side film encapsulation effect thereby providing a film encapsulation structure having an increased gas blocking capability to effectively protect the OLED device, increase the life span of the OLED device, and suit the need of encapsulation of a flexible OLED panel. In addition, the fabrication method is easy to carry out. The present invention provide an OLED panel, in which at least two loops of spaced barrier walls are provided on an outer circumference of the OLED device, wherein an organic buffer layer is arranged between a first inorganic blocking layer and a second inorganic blocking layer at a location above a light emission area defined and delimited by the barrier walls and a loop of densification layer is arranged between the first inorganic blocking layer and the second inorganic blocking layer at a location above an area between two adjacent ones of the barrier walls so as to form a complicated path that retards invasion of water vapor and oxygen in a lateral side encapsulation structure to improve a lateral side film encapsulation effect thereby providing a film encapsulation structure having an increased gas blocking capability to effectively protect the OLED device, increase the life span of the OLED device, and suit the need of encapsulation of a flexible OLED panel.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light emitting display (OLED) panel fabrication method, comprising the following steps:
    Step S1: providing a substrate, forming an OLED device on the substrate; and arranging at least two circumferential loops of barrier walls, which are spaced from each other, on the substrate along an outer circumference of the OLED device, wherein an innermost loop of the barrier walls defines and delimits a light emission area on the substrate;
    Step S2: depositing a first inorganic blocking layer of an entire surface to completely cover the OLED device and entirety of the barrier walls;
    Step S3: coating and forming an organic buffer layer on a portion of the first inorganic blocking layer that corresponds to the light emission area and coating and forming a densification layer on a portion of the first inorganic blocking layer that corresponds to an area between every two adjacent ones of the barrier walls; and
    Step S4: depositing a second inorganic blocking layer of an entire surface to completely cover the organic buffer layer, entirety of the densification layer, and the entirety of the barrier walls;
    wherein the at least two circumferential loops of barrier walls comprise three circumferential loops including the innermost loop, an intermediate loop, and an outermost loop, and the densification layer comprises a first densification layer formed between the barrier walls of the innermost and the intermediate loop and a second densification layer formed between the barrier walls of the intermediate loop and the outermost loop, wherein the first and second densification layers are both formed on the first inorganic blocking layer and are both covered by the second inorganic blocking layer, such that the first and second densification layers are interposed between the first and second inorganic layers and separate from each other.

2. The OLED panel fabrication method as claimed in claim 1, wherein Step S3 adopts an inkjet printing operation to form the densification layer and the organic buffer layer, wherein the densification layer has a height equal to or less than a height of the barrier walls; and the height of the densification layer is equal to or greater than a height of the organic buffer layer.

3. The OLED panel fabrication method as claimed in claim 1, wherein the densification layer is formed of a material that comprises one or multiple ones of acrylate, epoxy, siloxane, silicon nitride, silicon dioxide, silicon oxynitride, aluminum oxide, and titanium oxide.

4. The OLED panel fabrication method as claimed in claim 1, wherein the densification layer comprises a moisture absorbent to provide a function of moisture absorption.

5. The OLED panel fabrication method as claimed in claim 1, wherein Step S2 adopts plasma enhanced chemical vapor deposition to deposit and form the first inorganic blocking layer;
    Step S4 adopts plasma enhanced chemical vapor deposition to deposit and form the second inorganic blocking layer;
    the barrier walls formed in Step S1 are formed of a material that comprises an organic photoresist material;
    the organic buffer layer is formed of a material that comprises one or multiple ones of acrylate, epoxy, and siloxane; and
    the first inorganic blocking layer and the second inorganic blocking layer are each formed of a material that comprises one or multiple ones of silicon nitride, silicon dioxide, silicon oxynitride, aluminum oxide, and titanium oxide.

6. An organic light emitting diode (OLED) panel, comprising:
    a substrate;
    an OLED device arranged on the substrate;
    at least two loops of barrier walls that are arranged on the substrate to be spaced from each other and located along an outer circumference of the OLED device, wherein an innermost loop of the barrier walls defines and delimits a light emission area on the substrate;
    a first inorganic blocking layer of an entire surface to completely cover the OLED device and entirety of the barrier walls;
    an organic buffer layer arranged on a portion of the first inorganic blocking layer that corresponds to the light emission area;
    a densification layer arranged between every two adjacent ones of the barrier walls; and a second inorganic blocking layer of an entire surface to completely cover the organic buffer layer, entirety of the densification layer, and the entirety of the barrier walls;

wherein the at least two circumferential loops of barrier walls comprise three circumferential loops including the innermost loop, an intermediate loop, and an outermost loop, and the densification layer comprises a first densification layer formed between the barrier walls of the innermost and the intermediate loop and a second densification layer formed between the barrier walls of the intermediate loop and the outermost loop, wherein the first and second densification layers are both formed on the first inorganic blocking layer and are both covered by the second inorganic blocking layer, such that the first and second densification layers are interposed between the first and second inorganic layers and separate from each other.

7. The OLED panel as claimed in claim 6, wherein the densification layer has a height equal to or less than a height of the barrier walls; and the height of the densification layer is equal to or greater than a height of the organic buffer layer.

8. The OLED panel as claimed in claim 6, wherein the densification layer is formed of a material that comprises one or multiple ones of acrylate, epoxy, siloxane, silicon nitride, silicon dioxide, silicon oxynitride, aluminum oxide, and titanium oxide.

9. The OLED panel as claimed in claim 6, wherein the densification layer comprises a moisture absorbent to provide a function of moisture absorption.

10. The OLED panel as claimed in claim 6, wherein the organic buffer layer is formed of a material that comprises one or multiple ones of acrylate, epoxy, and siloxane; and the first inorganic blocking layer and the second inorganic blocking layer are each formed of a material that comprises one or multiple ones of silicon nitride, silicon dioxide, silicon oxynitride, aluminum oxide, and titanium oxide.

11. An organic light emitting display (OLED) panel fabrication method, comprising the following steps:

Step S1: providing a substrate, forming an OLED device on the substrate; and arranging at least two circumferential loops of barrier walls, which are spaced from each other, on the substrate along an outer circumference of the OLED device, wherein an innermost loop of the barrier walls defines and delimits a light emission area on the substrate;

Step S2: depositing a first inorganic blocking layer of an entire surface to completely cover the OLED device and entirety of the barrier walls;

Step S3: coating and forming an organic buffer layer on a portion of the first inorganic blocking layer that corresponds to the light emission area and coating and forming a densification layer on a portion of the first inorganic blocking layer that corresponds to an area between every two adjacent ones of the barrier walls; and Step S4: depositing a second inorganic blocking layer of an entire surface to completely cover the organic buffer layer, entirety of the densification layer, and the entirety of the barrier walls;

wherein the densification layer has a height equal to or less than a height of the barrier walls; and wherein the at least two circumferential loops of barrier walls comprise three circumferential loops including the innermost loop, an intermediate loop, and an outermost loop, and the densification layer comprises a first densification layer formed between the barrier walls of the innermost and the intermediate loop and a second densification layer formed between the barrier walls of the intermediate loop and the outermost loop, wherein the first and second densification layers are both formed on the first inorganic blocking layer and are both covered by the second inorganic blocking layer, such that the first and second densification layers are interposed between the first and second inorganic layers and separate from each other.

12. The OLED panel fabrication method as claimed in claim 11, wherein the height of the densification layer is equal to or greater than a height of the organic buffer layer.

13. The OLED panel fabrication method as claimed in claim 11, wherein the densification layer is formed of a material that comprises one or multiple ones of acrylate, epoxy, siloxane, silicon nitride, silicon dioxide, silicon oxynitride, aluminum oxide, and titanium oxide.

14. The OLED panel fabrication method as claimed in claim 11, wherein the densification layer comprises a moisture absorbent to provide a function of moisture absorption.

15. The OLED panel fabrication method as claimed in claim 11, wherein Step S2 autopsy plasma enhanced chemical vapor deposition to deposit and form the first inorganic blocking layer;

Step S4 adopts plasma enhanced chemical vapor deposition to deposit and form the second inorganic blocking layer;

the barrier walls formed in Step S1 are formed of a material that comprises an organic photoresist material;

the organic buffer layer is formed of a material that comprises one or multiple ones of acrylate, epoxy, and siloxane; and the first inorganic blocking layer and the second inorganic blocking layer are each formed of a material that comprises one or multiple ones of silicon nitride, silicon dioxide, silicon oxynitride, aluminum oxide, and titanium oxide.

* * * * *